United States Patent [19]

Gruber et al.

[11] Patent Number: 4,886,627
[45] Date of Patent: Dec. 12, 1989

[54] CONDUCTIVE STRUCTURES IN POLYMERS

[75] Inventors: Harald Gruber, Dresden; Andreas M. Richter, Halle-Neustadt; Egon Fanghänel, Halle; Hans-Klaus Roth, Leipzig; Heinz Friedrich, Leipzig; Siegfried Maras, Leipzig, all of German Democratic Rep.

[73] Assignee: VEB Metallurgieelektronik Leipzig, Leipzig, German Democratic Rep.

[21] Appl. No.: 168,348

[22] Filed: Mar. 15, 1988

[30] Foreign Application Priority Data

Apr. 9, 1987 [DD] German Democratic Rep. ... 301649

[51] Int. Cl.$^4$ .............................................. A01B 1/06
[52] U.S. Cl. .................... 252/513; 252/519; 252/512; 427/53.1; 427/412.3; 524/135; 524/440
[58] Field of Search ............... 252/500, 512, 513, 519; 526/285; 522/71, 81; 525/370, 371, 360; 430/66, 67, 83; 524/435, 440; 427/53.1, 412.3

[56] References Cited

U.S. PATENT DOCUMENTS

| 4,230,493 | 10/1980 | Felten | 106/1.13 |
| 4,289,534 | 9/1981 | Deffeyes et al. | 106/1.14 |
| 4,478,922 | 10/1984 | Perlstein et al. | 430/58 |

FOREIGN PATENT DOCUMENTS

| 0134026 | 3/1985 | European Pat. Off. |
| 0147871 | 7/1985 | European Pat. Off. |
| 2627828 | 1/1977 | German Democratic Rep. |
| 211118 | 4/1984 | German Democratic Rep. |
| 221868 | 5/1985 | German Democratic Rep. |
| 235654 | 5/1986 | German Democratic Rep. |
| 238614 | 8/1986 | German Democratic Rep. |

OTHER PUBLICATIONS

A. M. Richter et al., Journal f. prakt. Chemie 329, pp. 811–816 (1987).
J. Simitzis et al., Makromol. Chem. 185, pp. 2569–2581 (1984).
H. J. Mair, Gummi, Faser, Kunststoff 38 (1985) 3, pp. 122, 124.
T. Slupkowski, Phys. stat. sol. (a) 90 (1985), pp. 737–741.
J. E. Osterholm et al., Journal of Appl. Polymer Sci., vol. 27, pp. 931–936 (1982).

Primary Examiner—Josephine Barr
Attorney, Agent, or Firm—Jordan and Hamburg

[57] ABSTRACT

Conductive structures in polymers are obtained by a method in which poly(organylheteroacetylenes) of formula I

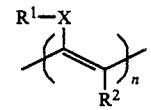

or a mixture of poly(organylheteroacetylenes) of formula I and other polymers are exposed to radiation of high energy density, preferably laser radiation. At relatively low temperatures of 100° C. to 600° C., the polymer structure is effected so that electrically conductive structures result. The products are employed in electrical engineering, electronics and microelectronics, preferably as printed conductors. The invention makes it possible to inscribe long-term stable, conductive structures in an insulating polymer matrix in a one-step method, it being possible to use modern computer techniques (computer graphics) and to produce computer-aided conductor structures directly. The polymers can be used without supports or applied on rigid or flexible materials.

6 Claims, No Drawings

CONDUCTIVE STRUCTURES IN POLYMERS

BACKGROUND OF THE INVENTION

The invention relates to conductive structures in polymers, which can be employed in electrical engineering, electronics and microelectronics.

The use of polymers in electrical engineering, electronics and microelectronics for insulation purposes is well known. In this connection, the objective generally is to use, on the one hand, the well-known advantageous properties of polymers relative to metals, such as the freely selectable shaping, the flexibility, the slight weight, the easy means of processing and the practically unlimited chemical modifiability and, on the other hand, while retaining these positive properties, to use the polymers at the same time as electrically conductive materials. Different methods are employed to produce conductive polymeric materials (for example, B. R. Seymour, Conductive Polymers, Plenum Press, New York 1981 and H. Kuzmany, Electronic properties of polymers and related compounds, Springer Verlag, Berlin, Heidelberg, New York, 1985).

The known solutions for producing conductive layers, for example, by introducing low molecular weight charge-transfer (CT) complexes in the polymer matrices (European Patents 0147 871 A2 and 0134 026 A1, U.S. Pat. No. 4,478,922), the treatment with suitable oxidizing and reducing agents (see R. Seymour, Conductive Polymers) or the admixture of carbon black (T. Slupkowski, Phys. stat. sol. (a) 90 (1985) 737-741) are not suitable for selective structuring in the $\mu$m range, as required, for example, for printed conductors in microelectronics or the products do not exhibit the resistance to environmental effects which is required for application.

The previously known methods for achieving electrically conductive structures in polymers are very costly to realize technically and the end products exhibit an unfavorable environmental behavior.

For example, a method is described in German Offenlegungsschrift 2,627,828, in which a solution containing an organic $\pi$-electron donor compound and a halogenated hydrocarbon is applied to a substrate, after which the substrate is illuminated with actinic radiation in a predetermined pattern. The excess solvent and/or the halogenated hydrocarbon are/is then evaporated off. The compounds, used in the German Offenlegungsschrift 2,627,828, are of the donor $X_n$ type. The donor originates predominantly from the group comprising tetrathiafulvalene, tetraselenafulvalene, and cis/trans diselenadithiafulvalene and X originates from the group comprising F, Br, Cl, and I ($n<1$).

In addition, dyes are used when a layer combination is employed in the technically relevant visible spectral excitation region. The disadvantage of this multicomponent system consists predominantly of the complicated layer structure and thus of the expensive manner of producing the layers. Moreover, many CT complexes exhibit a decrease in electrical conductivity with duration of storage, so that the layers must be stabilized as well (for example, by protective coatings). These protective coatings generally are technically very expensive to realize, for example, by corona discharge polymerization, or require special polymers (for example, J. E. Osterholm et al., J. of Appl. Polymer Sci. 27 (1982) 931-936). If the layers are used for a printed circuit board, these necessary measures are very disadvantageous (for example, bonding).

Known solutions for producing printed conductors, setting contacts and contacts, in which metals are substituted for partially or completely, are based on the used of compositions with metallic, conductive components, such as silver particles (U.S. Pat. No. 4,289,534), gold particles (U.S. Pat. No. 4,230,493) or on the use of additives such as conductive carbon black, graphite, iron oxide, copper or aluminum particles, etc. (for example, M. J. Mair, Gummi, Faser, Kunststoffe 38 (1985) 3, 122-124). For example, in DD Patent 221,868 A1, a method is disclosed, in which compositions are used to produce printed conductors, the conductive components of which comprise carbon black or graphite particles. The lacquer with even more additives is sprayed, for example, on a conductive template, printed conductors resulting with a specific resistance of $2 \times 10^4 \Omega$ mm$^2$/m (60% by weight of graphite). It is, however, a disadvantage of this method that a selective and also computer-supported microstructuring, which permits different printed circuit board elements (printed conductors, active and passive system components) to be produced in the shortest time and in the smallest space, is not possible.

Other methods consist of producing electrically conductive materials through pyrolysis (pyroconversion) of polymers (for example, J. Simitzis, Makromol. Chem. 185 (1984) 2569-2581). Thermal degradation of polymers leads to materials which contain carbon in different modifications and are very resistant to the effects of high temperature and chemicals. It is an important disadvantage of the previously synthesized polymers that, on the one hand, they are not good film formers and, on the other, that the pyrolysis temperatures to produce the required conductivities are very high, for example 700° C. in the case of polyphenylenes. Pyrolysis products, produced at these temperatures, generally no longer have any coherence (J. Simitzis, Makromol. Chem 185 (1984) 2569-2581). It is a further disadvantage that the pyrolysis predominantly must taken place under inert conditions, as a result of which the technical effort involved is increased appreciably.

SUMMARY OF THE INVENTION

It is therefore an object of the invention to provide coherent, conductive structures in polymers by the action of radiation of high energy density at relatively low temperatures in a procedure that involves only a few steps.

Pursuant to the invention, the objective is accomplished by using poly(organylheteroacetylenes) of formula I

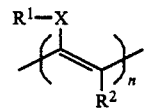

for the radiation-induced pyroconversion, wherein X may be sulfur or selenium; R$^1$ and R$^2$ may be alkyl with 1 or 12 and preferably 1 to 7 carbon atoms, preferably methyl, ethyl, n-propyl, i-propyl, t-butyl; R$^1$ and R$^2$ may be cycloalkyl with 3 to 10 and preferably 5 to 7 carbon atoms, preferably cyclopentyl, cyclohexyl; R$^1$ and R$^2$ may be aralkyl with 7 to 15 and preferably 7 to 11 carbon atoms, preferably benzyl, phenylethyl; R$^1$ and R$^2$ may be aryl with 6 to 18 and preferably 6 to 12 carbon atoms, preferably phenyl, naphthyl; $R^1$ and $R^2$ may be heterocyclyl with 2 to 10 and preferably 1 to 4 identical or different heteroatoms, such as nitrogen, oxygen, sulfur, preferably with 4 to 7 carbon atoms and 1 to 2 identical or different heteroatoms, preferably oxygen and sulfur, preferably tetrahydrofuryl, tetrahydrothiophenyl, tetrahydropyranyl, thienyl, furyl, pyridyl; and wherein $R^2$ additionally may be hydrogen or a group $R^3$—Y, wherein Y may be sulfur or selenium; X and Y may be identical, $R^3$ having the meaning given for $R^1$; wherein $R^1$ and $R^2$ or $R^1$ and $R^3$ may be identical; and wherein $R^1$ and/or $R^2$ may be substituted by groups such as alkoxy, aralkoxy, aryloxy, heterocyclyloxy, alkylthio, aralkylthio, arylthio, heterocyclylthio, alkylseleno, aralkylseleno, arylseleno, heterocyclylseleno, the alkyl, aralkyl, aryl or heterocyclyl moieties, on which these groups are based, having the meaning given for $R^1$, cyano, halogen such as fluorine, chlorine, bromine or iodine and preferably chlorine or bromine, nitro, carbonyl substituents with 1 to 15 and preferably 1 to 5 carbon atoms, preferably formyl, acetyl, chlorocarbonyl, alkoxycarbonyl, the alkyl groups, on which the alkoxy moiety is based, having the meaning given for $R^1$, aminocarbonyl, carboxylate or ammonium, sulfonium, phosphonium groups and preferably trialkylammonium, dialkylsulfonium, trialkylphosphonium, the alkyl groups having the meaning given for $R^1$; and wherein $R^1$ and/or $R^2$ of different monomer units may be linked to one another directly or through groups, preferably methylene, benzylidene, phenylene, it being possible for the $R^1$—X and/or $R^2$ substituents of different monomer units to be identical; and wherein n may assume values of 2 and higher and preferably values between 3 and 200. The poly(organylheteroacetylenes) can be synthesized simply by complex-catalyzed polymerization of the appropriate organylheteroacetylenes (reference: DD WP 211,118, DD WP 235, 654, DD WP 238, 614, Richter, A. M. et al., Journal fuer praktische Chemie 329 (1987) 811). The $R^1$ and $R^2$ groups can be varied within wide limits.

The poly(organylheteroacetylenes) described are readily soluble in conventional solvents such as chloroform and tetrahydrofuran and have very good film-forming properties. By choosing the appropriate substituents and synthesis conditions for the polymers, sensitization for the wavelength of the irradiation to be used is possible at the same time. By using polymerization temperatures above 25° C., it is possible to shift the absorption of the poly(organylheteroacetylene) to longer wavelengths. This shift is also supported by using special catalysts, preferably bis-triorganylphosphine-Ni(II) iodide. At the same time, the color of the polymers changes from gray-brown to brown-red. Pursuant to the invention, the above-mentioned polymers are dissolved in a conventional commercial solvent and, using known coating methods, applied on rigid or flexible support materials. The curing of the layers is accomplished by evaporating the solvent. Subsequently, the layer combination is acted upon with radiation of high energy density, preferably laser radiation, in such a way, that electrically conductive structures result. For this purpose, the radiation is deflected and modulated by suitable methods and, if necessary, focused into the working plane. This process preferably is computer-aided, the radiation being deflected and/or the layer combination being moved to register the desired structures. The irradiation may take place in an oxidizing atmosphere under normal conditions. The choice of energy sources to be used, such as laser, depends on the microstructuring required, the irradiation being selected, so that the required temperature is reached. At temperatures of 100° C. to 600° C. and preferably of 150° C. to 300° C., sulur- or selenium-containing pyrolysates, rich in carbon and having a high electrical conductivity, are formed by the above-mentioned poly(organylheteroacetylenes) in one step. The unirradiated regions need not be removed. The electrically conductive regions produced are resistant to environmental influences, such as the humidity of the air.

To protect the conductive structures and to increase the insulation, a protective layer can can subsequently be applied on the printed circuit board or the irradiation can be conducted through a previously applied protective layer.

Pursuant to the invention, the poly(organylheteroacetylenes) may also be mixed with other polymers. For application cases requiring a special type of polymer, it is possible to incorporate the poly(organylheteroacetylenes) into the matrix polymer or, if the solvents for the matrix polymers and the poly(organylheteroacetylenes) are the same, to produce layers. Polymers such as polystyrene and polyvinyl chloride are suitable. The choice of polymer depends on the intended application. For example, if structuring is to be undertaken by focusing the radiation in deeper layer regions, transparent polymers, such as polystyrene for the visible region of the spectrum, should be selected for the active radiation. By these means, it is possible to adapt the absorption behavior of a material to the radiation source and a high effectiveness can be achieved in the utilization of the radiation employed.

By addition of metal compounds of the elements of the 8th sub-group, preferably their salts or phosphine, phosphite, or carbonyl complexes, it is possible to increase the sensitivity of the layers for the radiation used.

The advantages achieved by the invention are to be seen essentially therein that the conductive structures, primarily however printed conductors, can be inscribed in one step in an insulating polymer matrix with the use of radiation of high energy density.

Compared to the previously known expensive methods of producing conductor structures, preferably for printed circuit boards, only a few steps are necessary. As a result, time and material are saved and the transfer errors, which arise due to the many steps previously necessary, no longer occur.

The invention also makes it possible to use modern computer techniques (computer graphics), ensures a computer-aided direct production of conductor structures and also fits the trend of miniaturizing the conductive pattern. Through the use of special film-forming polymeric materials, which make possible a conversion to electrically conductive structures at comparatively low temperatures with exclusion of the deficiencies of the prior art and through structuring these materials in one-step method, long-term stable conductive regions are produced in the important $\mu$m region. At the same time, these conductive paths are insulated by the polymer matrix. Moreover, the conductive regions comprise coherent structures, which thus have the coherence required preferably for a printed conductor.

Due to the surprisingly low pyrolysis temperatures, high energy savings and high registering speeds with very good resolution are possible. Furthermore, because the required pyrolysis temperature is low, there is little stress on the support materials used, which preferably are flexible materials.

DETAILED DESCRIPTION OF PREFERRED EMBODIMENTS

The invention is to be described in greater detail in the following using several operating examples.

EXAMPLE 1

Poly(bismethylthioacetylene) of average molecular weight $\overline{M}_n = 3770$ is dissolved in chloroform to form a 5% by weight solution and cast on polyethylene films, so that 10 μm thick layers are formed.

The films, so prepared, are irradiated stripwise by means of an argon ion laser (wavelength of 488 nm, radiation flux of 1.4 W) and follow-on optics. The scanning speed is 5 m/sec. The irradiated strips have an electrical conductivity of $10^2$ S/cm. Temperatures of about 280° C. occurred during the irradiation.

EXAMPLE 2

Poly(bispropylthioacetylene), $\overline{M}_n = 3410$, is dissolved in methylene chloride to form a 5% by weight solution. Tetrakis(triphenylphosphito)nickel(O) ($10^{-2}$% by weight) is added and the solution is cast on polyimide films, so that 10 μm layers are formed.

The films, so prepared, are irradiated as in Example 1. The scanning speed is 8 m/sec. The irradiated strips have an electrical conductivity of $5 \times 10^2$ S/cm. Temperatures ranging from 270° C. to 320° C. arose during the irradiation.

EXAMPLE 3

Poly(bis-n-butylthioacetylene), $\overline{M}_n = 4450$, is dissolved in chloroform to form a 7.5% by weight solution and cast on polyimide films, so that 10 μm thick layers are formed.

The films, so prepared, are irradiated as in Example 1. The scanning speed is 8 m/sec. Temperatures of about 250° C. to 280° C. occur.

The irradiated paths have an electrical conductivity of $2 \times 10^2$ S/cm. Between two parallel printed conductors, 50 mm long and spaced 2 mm apart, the unirradiated material was measured to have a resistance greater than $10^{14} \Omega$

EXAMPLE 4

Ten percent by weight of polystyrene and 90% by weight of poly(bisethylthioacetylene), $\overline{M}_n = 1260$, are dissolved in chloroform and cast on polyimide film, so that 10 μm thick layers are formed.

This mixture of polymers is irradiated as in Example 1. The scanning speed selected is 6 m/sec, temperatures of about 250° C. occurring briefly.

The irradiated paths have an electrical conductivity of $2 \times 10^2$ S/cm.

EXAMPLE 5

Poly(bisethylthioacetylene), $\overline{M}_n = 1260$, is dissolved in toluene to form a 7.5% by weight solution. Trinitrofluorenone (3% by weight based on the polymer) is dissolved in the solution, which is then cast on polyimide films so that 10 μm thick layers are formed. The films prepared are irradiated as in Example 1, the scanning speed being 8 m/sec. The temperatures arising during the irradiation are about 260° C.

The irradiated strips have an electrical conductivity of $10^2$ S/cm.

EXAMPLE 6

Five percent by weight poly(cyclohexylthioacetylene), $\overline{M}_n = 1830$, is dissolved in tetrahydrofuran with addition of 1% by weight of bis-triphenylphosphine-Ni(II) bromide (based on the polymer) and cast on polyimide films, so that 10 μm thick layers are formed. The films, so prepared, are irradiated as in Example 1. The scanning speed is 8 m/sec. Temperatures of about 280° C. arise. The irradiated strips have an electrical conductivity of $2 \times 10^2$ S/cm.

EXAMPLE 7

Ten percent by weight poly(bisbenzylthioacetylene), $\overline{M}_n = 860$, is dissolved in chloroform and cast on polyimide films so that 10 μm thick layers are formed. The films, so prepared, are irradiated as in Example 1. The scanning rate is 1 m/sec. Temperatures of about 550° C. arise. The irradiated strips have a conductivity of 10 S/cm.

EXAMPLE 8

A protective film of polyvinyl acetate is applied as well on film prepared as in Example 1. Irradiation is conducted through this protective film in the same registering regime. Under the irradiating conditions of Example 1, conductivities of $10^2$ S/cm arise.

EXAMPLE 9

Ten percent by weight poly(bisethylthioacetylene), $\overline{M}_n = 1260$, is dissolved in tetrahydrofuran with addition of 10% by weight polystyrene and 1% by weight tetrakis(triphenylphosphito)nickel(O) (both based on the polymer) and cast on polyimide films, so that 10 μm thick layers arise. The films, so prepared, are irradiated as in Example 1. The scanning rate is 5 m/sec. Temperatures of about 250° C. arise during the irradiation. The irradiated strips have an electrical conductivity of 1 S/cm.

EXAMPLE 10

Ten percent by weight poly(bisethylselenoacetylene), $\overline{M}_n = 1400$, is dissolved in chloroform and cast on polyimide films, so that 12 μm thick layers result. The layers, so prepared, are irradiated as in Example 1. The scanning rate is 4 m/sec. Temperatures of about 150° C. occur. The irradiated strips have an electrical conductivity of $10^{-3}$ S/cm.

We claim:

1. Method of treating polymers to make them electrically conductive, comprising exposing a poly(organylheteroacetylene) or a mixture of poly(organylheteroacetylenes) of the formula

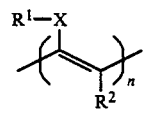

to radiation of high energy density thereby to increase the temperature of the exposed polymers to 100° to 600° C., wherein the formula: X is sulfur or selenium; $R^1$ and $R^2$ each is alkyl of 1 to 12 carbon atoms or cycloalkyl of 3 to 10 carbon atoms or aralkyl of 7 to 15 carbon atoms or aryl of 6 to 18 carbon atoms or heterocyclyl of 2 to 10 identical or different heteroatoms or $R^2$ is hydrogen or a group $R^3$—Y, wherein Y is sulfur or selenium and $R^3$ is selected from the same alternatives as $R^1$ or any of $R^1$, $R^2$ and $R^3$ is substituted by a group selected from alkoxy, aralkoxy, aryloxy, heterocyclyloxy, alkylthio, aralkylthio, arylthio, heterocyclylthio, alkylseleno, aralkylseleno, arylseleno, heterocyclylseleno, the alkyl, aralkyl, aryl or heterocyclyl moieties, on which these groups are based, being selected from the same alternatives as $R^1$, cyano, fluorine, chlorine, bromine, iodine, nitro, carbonyl substituents with 1 to 15 carbon atoms, aminocarbonyl, carboxylate, ammonium groups, sulfonium groups, phosphonium groups; and wherein at least one of $R^1$ and $R^2$ of different monomer units of said poly(organylheteroacetylene) may be linked to one another directly or through methylene, benzylidene, or phenylene; and wherein n is at least 2.

2. The method of claim 1, wherein laser radiation is used as radiation of high energy density.

3. The method of claim 1, wherein temperatures of 150° C. to 300° C. are employed.

4. The method of claim 1, wherein metal compounds of nickel, cobalt or iron are mixed into the polymers prior to the exposure in a proportion, based on the polymer, of up to 5%.

5. The method of claim 1, wherein, prior to the exposure, over the poly(organylheteroacetylene) or mixture of poly(organylheteroacetylenes) is applied a protective polymer layer which is transparent to the radiation.

6. The method of claim 1, wherein, subsequent to the exposure, over the poly(organylheteroacetylene) or mixture of poly(organylheteroacetylenes) is applied a protective polymer layer.

* * * * *